(12) United States Patent
Honda

(10) Patent No.: US 8,891,148 B2
(45) Date of Patent: Nov. 18, 2014

(54) OPTICAL SCANNING DEVICE

(75) Inventor: Takeshi Honda, Tokyo (JP)

(73) Assignee: NEC Corporation, Tokyo (JP)

( * ) Notice: Subject to any disclaimer, the term of this patent is extended or adjusted under 35 U.S.C. 154(b) by 262 days.

(21) Appl. No.: 13/509,958

(22) PCT Filed: Oct. 28, 2010

(86) PCT No.: PCT/JP2010/069192
§ 371 (c)(1),
(2), (4) Date: Jul. 17, 2012

(87) PCT Pub. No.: WO2011/058884
PCT Pub. Date: May 19, 2011

(65) Prior Publication Data
US 2012/0275000 A1 Nov. 1, 2012

(30) Foreign Application Priority Data
Nov. 16, 2009 (JP) ................ P2009-260881

(51) Int. Cl.
G02B 26/08 (2006.01)
H02N 2/10 (2006.01)
B81B 3/00 (2006.01)
G02B 26/10 (2006.01)

(52) U.S. Cl.
CPC ............... *G02B 26/105* (2013.01); *H02N 2/10* (2013.01); *B81B 3/0072* (2013.01); *B81B 2201/042* (2013.01); *G02B 26/0841* (2013.01)
USPC ..................................... 359/224.1

(58) Field of Classification Search
CPC ............. G02B 26/105; G02B 26/0816; G02B 26/0833; G02B 26/0841
USPC .............. 359/199.1, 199.2, 212.1–214.1, 359/223.1–226.1
See application file for complete search history.

(56) References Cited

U.S. PATENT DOCUMENTS

2005/0219674 A1 10/2005 Asai et al.
2008/0043310 A1* 2/2008 Sato .............................. 359/224
2008/0144154 A1 6/2008 Asai
2008/0304124 A1 12/2008 Yoda
2009/0237627 A1 9/2009 Kobori et al.

FOREIGN PATENT DOCUMENTS

| CN | 101546104 A | 9/2009 |
|---|---|---|
| CN | 101551521 A | 10/2009 |
| JP | 2004-191953 A | 7/2004 |
| JP | 2006-099045 A | 4/2006 |

(Continued)

OTHER PUBLICATIONS

Communication dated Oct. 12, 2013, issued by the State Intellectual Property Office of the People's Republic of China in corresponding Application No. 201080051426.X.

*Primary Examiner* — Euncha Cherry
(74) *Attorney, Agent, or Firm* — Sughrue Mion, PLLC

(57) ABSTRACT

An optical scanning device of the present invention includes: an oscillating mirror that reflects incident light; a first beam unit that is coupled to one end of the oscillating mirror; a second beam unit that is coupled to another end of the oscillating mirror; a first driving unit that is coupled to the first beam unit, is disposed between the first beam unit and the first adjusting unit, and that causes the oscillating mirror to oscillate; and a first adjusting unit that is coupled to the first driving unit, and adjusts a modulus of elasticity of the first beam unit by elastically deforming the first beam unit.

19 Claims, 14 Drawing Sheets

(56) References Cited

FOREIGN PATENT DOCUMENTS

| | | |
|---|---|---|
| JP | 2006-195290 A | 7/2006 |
| JP | 2007-025608 A | 2/2007 |
| JP | 2007-287931 A | 11/2007 |
| JP | 2008-096750 A | 4/2008 |
| JP | 2008-304553 A | 12/2008 |
| JP | 2009-260881 A | 11/2009 |

* cited by examiner

OPTICAL SCANNING DEVICE

CROSS REFERENCE TO RELATED APPLICATIONS

This application is a National Stage of International Application No. PCT/JP2010/069192 filed Oct. 28, 2010, claiming priority based on Japanese Patent Application No. 2009-260881, filed Nov. 16, 2009, the contents of all of which are incorporated herein by reference in their entirety.

TECHNICAL FIELD

The present invention relates to an optical scanning device that, by changing the angle between incident light and a reflecting surface, performs scanning of that reflected light.

BACKGROUND ART

Optical scanning devices that scan light are widely used in digital copiers, laser printers, bar code readers, scanners, projectors, and the like. As this optical scanning device, conventionally a polygon mirror or galvanometer mirror that uses a motor has generally been used.

On the other hand, with the developments in ultra-fine processing technology in recent years, optical scanning devices manufactured by applying MEMS technology have made significant advances. Among these, an optical scanning device that scans light by causing an oscillating mirror to oscillate in a reciprocating manner with a beam unit serving as a rotating shaft has been attracting attention. Compared with a conventional optical scanning device that uses rotation of a polygon mirror or the like using a motor, due to an oscillating mirror that is formed by MEMS technology having a simple structure and integral molding by a semiconductor process being possible, there are the advantages of miniaturization and cost reduction being easy, and speeding up being easy due to the miniaturization.

In an oscillating mirror that utilizes MEMS technology, the drive frequency and the resonance frequency of the structure are generally made to match in order to increase the oscillation angle. The resonance frequency fr of the mirror is given by the following equation from the torsion spring constant k of the beam unit, and the inertia moment IM of the oscillating mirror.

$$fr = 1/(2\pi\sqrt{(k/IM)}) \quad (1)$$

With the width of the beam unit being w, the thickness t, the length L, and assuming t<w, the torsion spring constant k in Equation (1) is given by the following equation.

$$k = (G\beta tw^3)/L \quad (2)$$

Here, G is the transverse elasticity constant, and is represented by $G=E/(2(1+v))$, using the Young's modulus E and the Poisson's ratio v of the material that forms the beam unit. $\beta$ is a constant determined from the ratio of w and t of the beam.

At the time of oscillation of the oscillating mirror, the beam unit undergoes torsional deformation at high speed and for a long time. However, since the beam unit and the oscillating mirror are integrally molded with single-crystal silicon, it is considered to possess sufficient endurance to this deformation.

Thus, the resonance frequency is determined from the inertia moment of the oscillating mirror and the torsion spring constant of the beam unit and the like. However, on the other hand, it is not possible to avoid variations in these values due to differences in the processing accuracy and ambient temperature. For that reason, variations also occur in the resonance frequency.

Therefore, in order to solve the problem mentioned above, an optical scanning device has been proposed in which an adjusting mechanism for the resonance frequency of the oscillating mirror is provided. With the adjusting mechanism of this optical scanning device, it is possible to adjust fluctuations of the resonance frequency due to variations in the processing accuracy of members and changes in the ambient temperature, and to keep the resonance frequency constant.

As such a constitution, for example Patent Document 1 discloses a resonance-type optical scanner that has a first beam unit, a second beam unit, a first piezoelectric element unit, and a power supply unit. The first beam unit is coupled to one end of the oscillating mirror. The second beam unit is coupled to the other end of the oscillating mirror. The first piezoelectric element unit causes the first beam unit to undergo elastic deformation. The power supply unit applies a voltage for driving the oscillating mirror to the first piezoelectric element unit. This resonance-type optical scanner, by the first supply unit applying a direct voltage component to the first piezoelectric element unit to produce a tensile force in the first beam unit and the second beam unit, changes the modulus of elasticity of the beam units, and performs adjustment of the resonance frequency.

However, in Patent Document 1, the piezoelectric element (metal thin film or ceramic polycrystalline body) that is laminated on the surface of the beam unit is directly influenced by the torsional deformation of the beam units during resonance, and so defects occur from the grain boundary, and a fatigue breakdown easily occurs. That is to say, the problems occur of the adjustment accuracy of the resonance frequency falling, and adjustment no longer being possible.

In contrast to this, Patent Document 2 discloses a device that includes a first beam unit that is coupled to one end of an oscillating mirror, a second beam unit that is coupled to the other end of the oscillating mirror, and a first structure for causing the first beam unit to undergo elastic deformation. This device produces tensile force in the first beam unit by applying a voltage to the first structure, to perform adjustment of the resonance frequency. In this case, the oscillating mirror is assumed to be driven by electrostatic force with electrodes arranged on the lower unit or side surfaces of the mirror.

PRIOR ART DOCUMENTS

Patent Documents

[Patent Document 1] Japanese Unexamined Patent Application, First Publication No. 2007-25608
[Patent Document 2] Japanese Unexamined Patent Application, First Publication No. 2006-195290

SUMMARY OF THE INVENTION

Problem to be Solved by the Invention

However, in the constitution of the device of Patent Document 2, even in the case of driving the oscillating mirror by static electricity from the bottom or side surfaces of the mirror, due to the first structure and the first beam unit being coupled, swinging of the first structure itself cannot be avoided. For that reason, there has been the problem of the piezoelectric element of the first structure being influenced by the mirror oscillation, and the adjustment accuracy of the resonance frequency falling.

The present invention has been achieved in view of the above circumstances, and an object thereof is to provide an optical scanning device that can adjust the resonance frequency with a high degree of accuracy by a simple constitution, and can maintain a stable operation.

Means for Solving the Problem

In order to solve the aforementioned problems, an optical scanning device of the present invention includes: an oscillating mirror that reflects incident light; a first beam unit that is coupled to one end of the oscillating mirror; a second beam unit that is coupled to another end of the oscillating mirror; a first driving unit that is coupled to the first beam unit, is disposed between the first beam unit and the first adjusting unit, and that causes the oscillating mirror to oscillate; and a first adjusting unit that is coupled to the first driving unit, and adjusts a modulus of elasticity of the first beam unit by elastically deforming the first beam unit.

Effect of the Invention

According to the present invention, since the first adjusting unit is disposed sandwiching the first driving unit with the first beam unit on the opposite side, during the oscillation of the beam unit, the first adjusting unit is hindered from being affected by deformation of the beam unit. Thereby, since it is possible to perform adjustment of the resonance frequency by the first adjusting unit with a high degree of accuracy, it is possible to suppress variations of the resonance frequency due to temperature changes and the fabrication process and the like in the conventional manner. As a result, it is possible to provide a highly reliable optical scanning device that can maintain a stable operation.

Also, structurally, the simple constitution is adopted of arranging the first adjusting unit that adjusts the modulus of elasticity of the first beam unit at the first driving unit on the opposite side of the first beam unit, and so there is an advantage of not requiring a new process. Accordingly, it is possible to improve the work efficiency and suppress an increase in costs by the addition of the first adjusting unit.

EMBODIMENTS FOR CARRYING OUT THE INVENTION

Next, exemplary embodiments of the present invention shall be described with reference to the figures.

First Exemplary Embodiment

Figure 1:
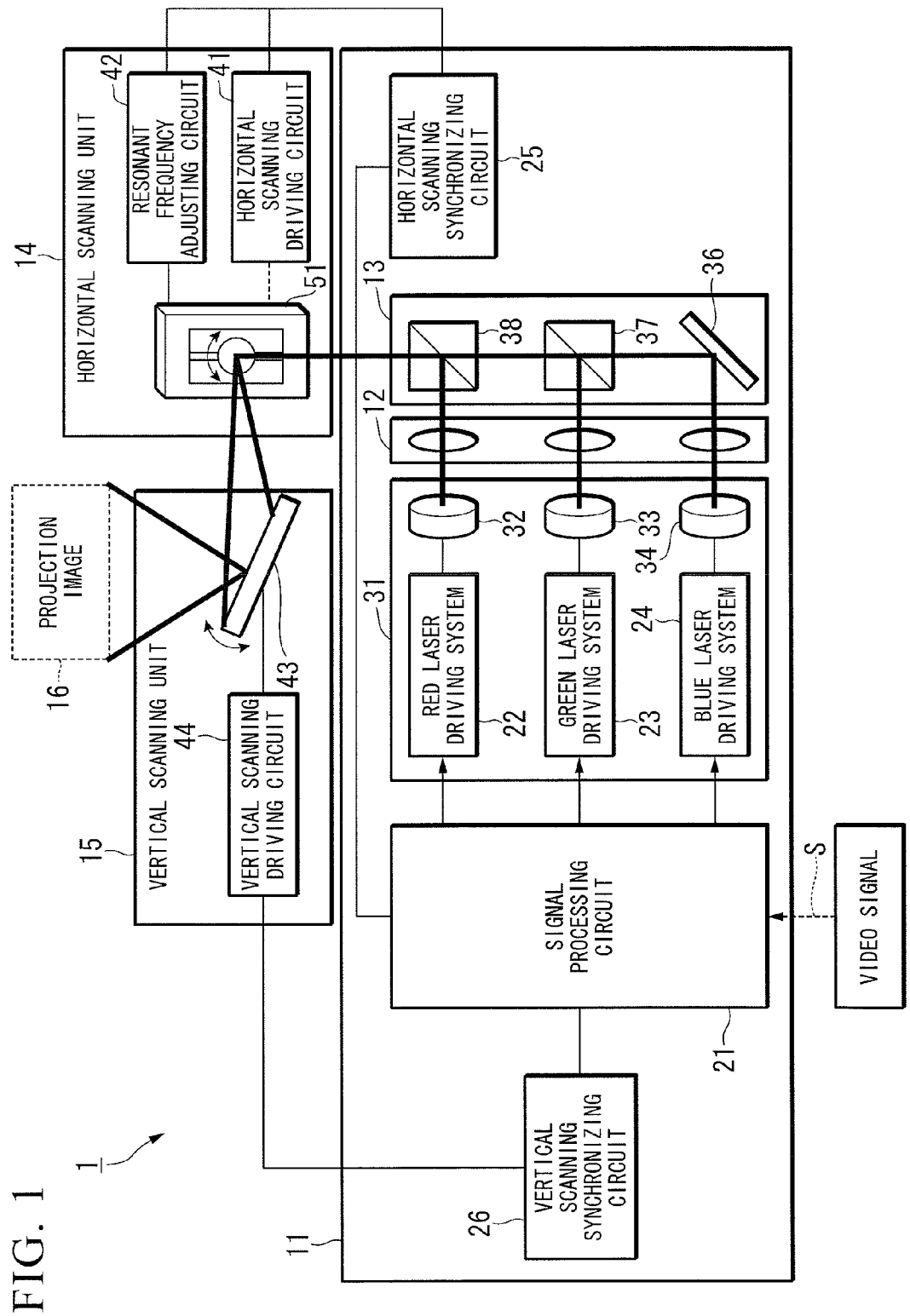
FIG. 1 is a block diagram that shows the overall constitution of an image display device in exemplary embodiments of the present invention.

Firstly, the overall constitution and operation of an image display device in which optical scanning devices of exemplary embodiments of the present invention are incorporated shall be described. FIG. 1 is a block diagram that shows the overall constitution of the image display device in the exemplary embodiments of the present invention.

As shown in FIG. 1, the image display device 1 of the present exemplary embodiment includes a light ray generating device 11 that generates light ray that is modulated in accordance with a video signal S that is supplied from outside. The light ray generating device 11 includes a signal processing circuit 21, a light source unit 31, a collimated optical system 12, and a combining optical system 13. The signal processing circuit 21 generates a signal that serves as the element for constituting an image based on the video signal S. The light source unit 31 converts the three video signals (R, G, B) that are output from the signal processing unit 21 into respective light beams. The collimated optical system 12 makes the light beams parallel light beams. The combining optical system 13 combines the light rays. The imaging display device 1 also includes a horizontal scanning unit 14 that scans in the horizontal direction in order to display the image of the light that is combined by the combining optical system 13, and a vertical scanning unit 15 that scans in the vertical direction the light rays scanned in the horizontal direction by the horizontal scanning unit 14. The image display device 1 emits on a screen 16 the light rays scanned in the horizontal direction and the vertical direction by the horizontal scanning unit 14 and the vertical scanning unit 15.

In the signal processing circuit 21, video signals of red (R), green (G), and blue (B) are generated, and the video signals are output to laser driving circuits (red laser driving circuit 22, green laser driving circuit 23, blue laser driving circuit 24), respectively. The signal processing circuit 21 outputs a horizontal synchronizing signal that is used by the horizontal scanning unit 14 via a horizontal scanning synchronizing circuit 25, and outputs a vertical synchronizing signal that is used by the vertical scanning unit 15 via a vertical scanning synchronizing circuit 26.

The light source unit 31 includes a red laser 32 and a red laser driving circuit 22, a green laser 33 and a green laser driving circuit 23, and a blue laser 34 and a blue laser driving circuit 24. The red laser 32 generates a red light beam. The red laser driving circuit 22 drives the red laser 32. The green laser 33 generates a green light beam. The green laser driving circuit 23 drives the green laser 33. The blue laser 34 generates a blue light beam. The blue laser driving circuit 24 drives the blue laser 34. As the lasers 32 to 34, a semiconductor laser or a fixed laser with a higher harmonic generator may be used.

The light beams that are respectively emitted from the lasers 32 to 34 are made parallel by the collimated optical system 12, and then made incident on dichroic mirrors 36 to 38 of the combining optical system 13. By these dichroic mirrors 36 to 38, the laser lights are selectively reflected or passed in relation to their wavelength.

The red, green and blue light rays that are made incident on the three dichroic mirrors 36 to 38 are wavelength selectively reflected or passed, and output to the horizontal scanning unit 14.

The horizontal scanning unit 14 scans a light beam in the horizontal direction in order to project as an image the light beam made incident from the combining optical system 13. The vertical scanning unit 15 scans a light beam in the vertical direction in order to project as an image the light beam made incident from the combining optical system 13.

The horizontal scanning unit 14 and the signal processing circuit 21 function as a horizontal optical scanning device. The vertical scanning unit 15 and the signal processing circuit 21 function as a vertical optical scanning device.

The horizontal scanning unit 14 has a horizontal scanning element (light scanning device) 51 for scanning a light beam in the horizontal direction, a horizontal scanning drive circuit 41 for driving the horizontal scanning element 51, and a resonance frequency adjusting circuit 42 for adjusting the resonance frequency of the horizontal scanning element 51.

The vertical scanning unit 15 includes a vertical scanning element 43 for scanning a light beam in the vertical direction, and a vertical scanning driving circuit 44 for driving the vertical scanning element 43. The horizontal scanning driving circuit 41 drives based on the horizontal synchronizing signal that is output from the horizontal scanning synchronizing circuit 25. The vertical scanning driving circuit 44 drives based on the vertical synchronizing signal that is output from the vertical scanning synchronizing circuit 26.

(Optical Scanning Element)

Figure 2:
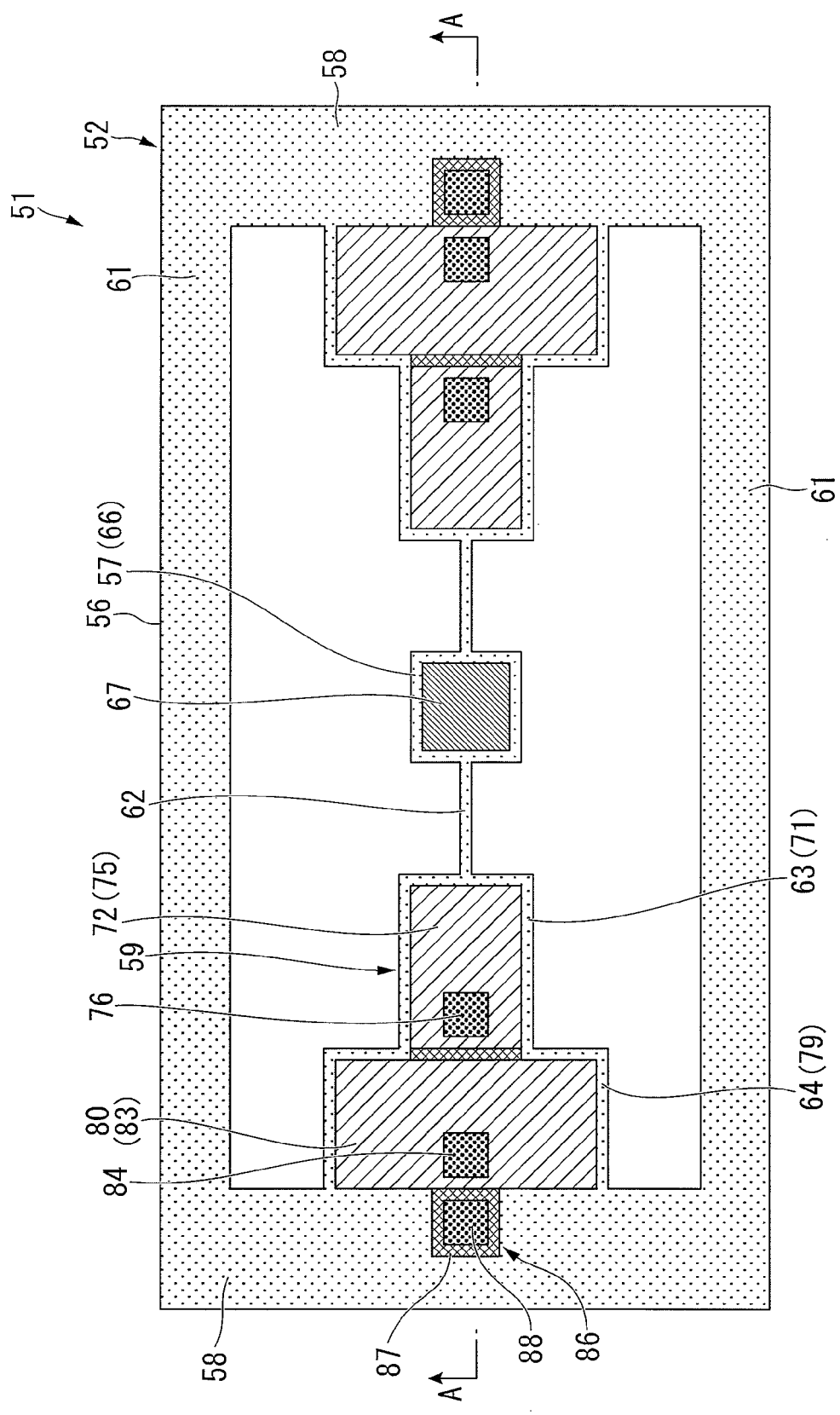
FIG. 2 is a plan view that shows the constitution of an optical scanning element in a first exemplary embodiment of the present invention.
Figure 3:
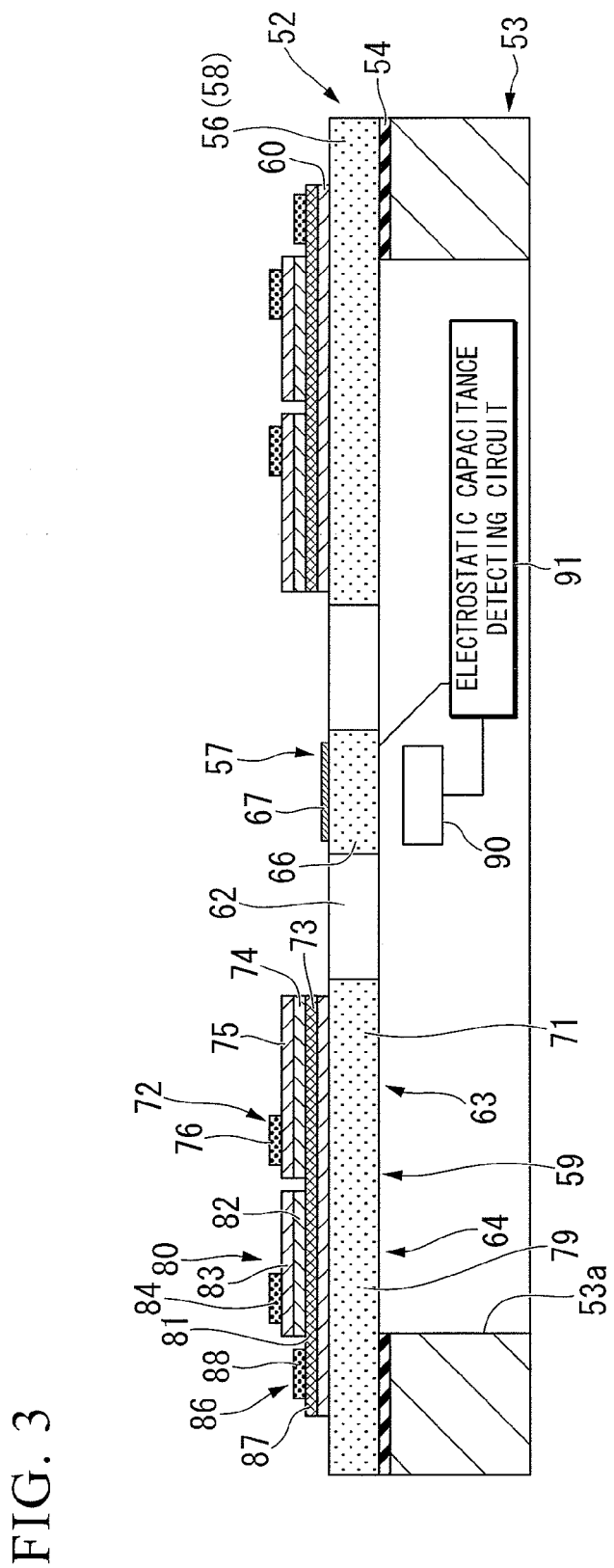
FIG. 3 is sectional view taken along line A-A in FIG. 2.

Next, the aforementioned horizontal scanning element (hereinbelow referred to as the optical scanning element) shall be described. FIG. 2 is a plan view that shows the constitution of an optical scanning element in the first exemplary embodiment. FIG. 3 is sectional view taken along line A-A in FIG. 2.

As shown in FIG. 2 and FIG. 3, the optical scanning element 51 is a resonance-type optical scanning element. The optical scanning element 51 is formed by the bonding of an upper frame 52 and a lower frame 53 (refer to FIG. 3) via an oxide film 54 that includes $SiO_2$ or the like (refer to FIG. 3). The upper frame 52 and the lower frame 53 are integrally formed by single-crystal silicon substrate that is capable of microfabrication and has suitable rigidity.

The upper frame 52 includes a base unit 56 with a rectangular frame shape, an oscillating mirror 57 that has a rectangular shape in plan view, and a pair of bridging units 59. The oscillating mirror 57 is arranged in the center portion of the base unit 56. The pair of bridging units 59 extend from opposite sides of the base unit 56 (hereinbelow referred to as the short side units 58) to the oscillating mirror 57, and support the oscillating mirror 57 from both ends.

The bridging units 59 have a pair of beam units (a first beam unit and a second beam unit) 62, driving units (a first driving unit and a second driving unit) 63, and adjusting units (a first adjusting unit and a second adjusting unit) 64. The pair of beam units 62 extend along mutually opposite directions from both end sides of the oscillating mirror 57 along the extending direction of the long side units 61 (lengthwise direction). The driving units 63, by being respectively coupled with these beam units 62, drive the oscillating mirror 57. The adjusting units 64 couple each driving unit 63 and each short side unit 58 of the base unit 56, and adjust the modulus of elasticity of the beam unit 62. These adjusting units 64, driving units 63 and beam units 62 extend so that the widths thereof from the short side unit 58 to the oscillating mirror 57 gradually decrease, and are integrally formed from the base unit 56 to the oscillating mirror 57. Since the bridging units 59 are members that are symmetrical centered on the oscillating mirror 57, the constitution of one bridging unit 59 shall be described in the following description.

The oscillating mirror 57 is equipped with a mirror substrate 66 and a reflecting film 67 that is formed on the mirror substrate 66. By the beam units 62 that are integrally formed at both side surfaces thereof, the mirror substrate 66 is supported in the vicinity of the center of each side. The reflecting film 67 is formed by a metal thin film that has a sufficient reflectance with respect to the light that is used. The dimensions of the oscillating mirror 57 and the two beam units 62 are designed so that the required resonance frequency is obtained.

The driving unit 63 includes a driving unit substrate 71 that is formed to be wider than the beam unit 62, and a piezoelectric element 72 that is formed via an oxide film 60 on the driving unit substrate 71. The distal end of the driving unit substrate 71 is integrally coupled to the beam unit 62. On the other hand, the basal end of the driving unit substrate 71 is integrally coupled to the adjusting unit 64. As shown in FIG. 3, the piezoelectric element 72 is formed by a lower electrode 73, a piezoelectric layer 74, and an upper electrode 75 being successively laminated on the oxide film 60 of the driving unit substrate 71. An electrode pad 76 is formed using an Al thin film or the like that is formed by mask deposition such as sputtering on the piezoelectric element 72 (upper electrode 75).

The adjusting unit 64 includes an adjusting unit substrate 79 that is formed between the driving unit 63 and the base unit 56, to be wider than the driving unit 63, and a piezoelectric element 80 that is formed via the oxide film 60 on the adjusting unit substrate 79. The distal end of the adjusting unit substrate 79 is integrally coupled to the driving unit substrate 71. The basal end of the adjusting unit substrate 79 is integrally coupled to the inner circumferential surface of the short side unit 58 of the base unit 56. The piezoelectric element 80 is formed by a lower electrode 81, a piezoelectric layer 82 and an upper electrode 83 being successively laminated on the oxide film 60 of the adjusting unit substrate 79. An electrode pad 84 is formed by an Al thin film or the like that is formed by mask deposition such as sputtering on the upper electrode 83. The electrode pads 76 and 84 may be formed at adequate positions on the upper electrodes 75 and 83 in the piezoelectric region (driving unit 63 and adjusting unit 64).

A land unit 86 that is connected to the lower electrodes 73 and 81 of the piezoelectric elements 72 and 80 is formed via an oxide film 60 at the coupling portion with the adjusting unit 64 at the short side unit 58. The land unit 86 functions as a common electrode with the driving unit 63 and the adjusting unit 64. The land unit 86 includes an electrode film 87 that is continuously formed from the bottom electrodes 73 and 81 of the driving unit 63 and the adjusting unit 64, and an electrode pad 88 that is formed on this electrode film 87. That is to say, while the bottom electrodes 73 and 81 of the driving unit 63 and the adjusting unit 64 and the electrode film 87 of the land unit 86 are integrally formed, the piezoelectric layers 74 and 82 and the upper electrodes 75 and 83 are not formed on the land unit 86. Between the driving unit 63 and the adjusting unit 64, among the piezoelectric elements 72 and 80, the piezoelectric layers 74 and 82 and the upper electrodes 75 and 83 are separated from each other. Each piezoelectric element 72 and 80 is constituted to be independently drivable. Here, as the aforementioned electrode pads 76, 84, 88, an Al thin film is formed by sputtering, but it is also possible to select another material such as Pt provided sufficient adhesion and conduction with the silicon substrate are obtained. Also, regarding the film formation method, it may be formed by another method. Voltage is impressed from the aforementioned horizontal scanning driving circuit 41 to the piezoelectric elements 72 and 80 via the electrode pads 76, 84, 88.

The adjusting unit 64 is formed with a width and thickness so as not to be influenced by deformation and the like during oscillation of the beam unit 62. As described above, the oxide film 60 is formed on the rear faces of the piezoelectric elements 72 and 80 and the land unit 86 at the upper frame 52, and via this oxide film 60, the piezoelectric elements 72 and 80, the electrode film 87 and the electrode pads 76, 84, 88 are formed. The aforementioned base unit 56, the mirror substrate 66, the driving unit substrate 71, and the adjusting unit substrate 79 are integrally formed by a semiconductor process.

The lower frame 53 is a rectangular frame-shaped member that is formed in the same shape as the base unit 56 in plan view. The lower frame 53 has an opening portion 53a where the region in which the oscillating mirror 57 oscillates is removed. The thickness of the lower frame 53 is designed to be thicker than the oscillating range of the oscillating mirror 57, and in consideration of not causing problems when handling the oscillating mirror 57.

(Operation Method of Optical Scanning Element)

Next, the operation of the aforementioned optical scanning element shall be described.

In the constitution of FIG. 2 and FIG. 3, an alternating voltage is applied between the electrodes 73 and 75 that are arranged on the front face or rear face of the piezoelectric layer 74 of the driving unit substrate 71, from the horizontal scanning driving circuit 41 via the electrode pads 76 and 88. Due to the application of this alternating voltage, the piezoelectric layer 74 is driven, and the length of the piezoelectric layer 74 changes along the extension direction of the beam unit 62. In this case, by applying an alternating voltage to the piezoelectric layer 74 of the driving unit 63, internal stress that is produced in the driving unit 63 acts to cause the oscillating mirror 57 to oscillate.

Thus, after the oscillating mirror 57 is activated, it is possible to increase the oscillation angle by resonant oscillation. Here, the case was described of using a piezoelectric element 72 that includes the upper electrode 75 and the lower electrode 73 sandwiching a piezoelectric layer 74 as the drive force for causing the oscillating mirror 57 to undergo resonant oscillation, but it is not limited thereto. Electromagnetic force or electrostatic force may be used as the driving force.

(Method of Adjusting Resonance Frequency)

The resonance frequency of the oscillating mirror 57 is determined by the respective materials and shapes such as the inertia moment of the oscillating mirror 57 and the rigidity of the beam unit 62. Accordingly, due to the processing accuracy and temperature changes, there may be cases of the target resonance frequency not being obtained.

The method of solving this problem is described as follows.

By applying a direct voltage to the piezoelectric element 80 of the adjusting unit 64 from the horizontal scanning driving circuit 41 via the electrode pads 84 and 88, the piezoelectric layer 82 is driven, whereby the length of the piezoelectric layer 74 changes along the extension direction of the beam unit 62 and stress is produced in the adjusting unit 64. This stress is transmitted to the beam unit 62 via the driving unit 63, and accompanying that, the beam unit 62 receives the stress. Specifically, the length in the extension direction of the beam unit 62 and the lateral cross-sectional shape of the beam unit 62 change. Specifically, in the case of the adjusting unit 64 becoming longer, compressive internal stress acts on the beam unit 62, and in the case of the adjusting unit 64 becoming shorter, tensile internal stress acts on the beam unit 62. Thereby, due to the modulus of elasticity of the beam unit 62 changing, it is possible to change the resonance frequency. The modulus of elasticity of the beam unit 62 changes by controlling the voltage that is applied to the piezoelectric element 80.

Therefore, if it is possible to detect the resonance frequency of the optical scanning element 51, by applying feedback to the applied voltage that is applied to the piezoelectric element 80 of the adjusting unit 64 in accordance with the detection value, it is possible to maintain the resonance frequency at a fixed value. As one method for resonance frequency detection, for example a structure as shown in FIG. 3 is conceivable. The oscillating mirror 57 that constitutes an electrode plane serves as one electrode, and an opposing electrode 90 is installed facing this electrode. By detecting the electrostatic capacitance that changes in accordance with changes between the electrode 90 and the oscillating mirror 57 using an electrostatic capacitance detecting circuit (resonance frequency detecting unit) 91, it is possible to detect the resonance frequency. Thereby, the signal to the adjusting unit 64 is suitably transmitted to the adjusting system, and it is possible to maintain the resonance frequency at a desired value.

This electrostatic capacitance detecting circuit 91 is one example of a resonance frequency detecting unit, and the resonance frequency may be detected by another method. It is also possible to detect the resonance frequency by the oscillation angle of the oscillating mirror 57. With the driving frequency set, it is possible to perform control so that the resonance frequency matches the driving frequency by controlling the piezoelectric element 80, while detecting the oscillation angle with a photodetection element that detects the scanning beam from the oscillating mirror 57 or a strain detection element that detects the strain of a twisted beam. Moreover, it is also possible to accommodate a reduction in the oscillation angle due to fluctuations in the environmental temperature. For that reason, feedback control of the displacement of the piezoelectric element 80 should be performed so that the oscillation angle maintains a fixed value.

(Method of Manufacturing Optical Scanning Element)

A method of manufacturing the aforementioned optical scanning element shall be described referring to FIGS. 4A to 4E, and FIGS. 5A to 5E.

Step 1

Figure 4A:
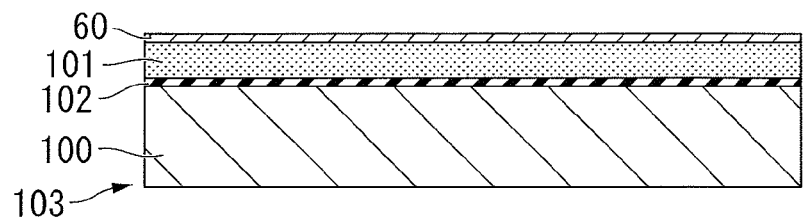
FIG. 4A is a process diagram for describing a manufacturing method of the optical scanning element shown in FIG. 2, and a cross-sectional diagram corresponding to FIG. 3.

First, as shown in FIG. 4A, an SOI (silicon on insulator) substrate 103 is prepared in which a support Si layer 100 (for example, with a thickness of 475 μm) and an active layer 101 (for example, with a thickness of 50 μm) are joined by an oxide film 102 (for example, with a thickness of 2 μm). In the present exemplary embodiment, the case is described of forming a plurality of optical scanning elements 51 collectively from one SOI substrate 103 using a semiconductor process. The support Si layer 100 is used as a device substrate that forms the lower frame 53. The active layer 101 is used as a device substrate that forms the upper frame 52. An oxidation treatment is performed in advance on a surface of the active layer 101 to form the oxide film 60.

Step 2

Figure 4B:
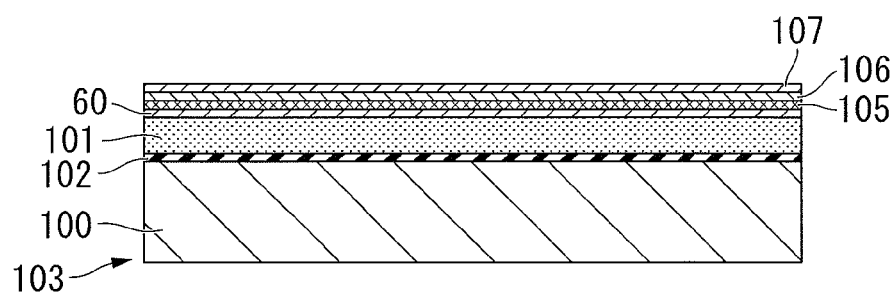
FIG. 4B is a process diagram for describing the manufacturing method of the optical scanning element shown in FIG. 2, and a cross-sectional diagram corresponding to FIG. 3.

Next, as shown in FIG. 4B, using a sputtering method or the like, sputtered films 105 to 107 of the lower electrodes 73 and 81, the piezoelectric layers 74 and 82, and the upper electrodes 75 and 83 and the electrode film 87 of the land unit 86 are laminated over the entire area of the active layer 101.

Step 3

Figure 4C:
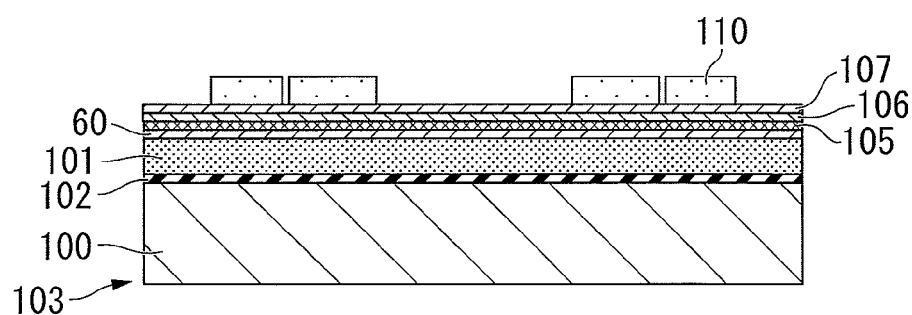
FIG. 4C is a process diagram for describing the manufacturing method of the optical scanning element shown in FIG. 2, and a cross-sectional diagram corresponding to FIG. 3.

Next, as shown in FIG. 4C, a resist 110 is applied on the sputtered film 107 of the upper electrodes 75 and 83, and patterning is performed so that the resist 110 remains at the formation regions of the upper electrodes 75 and 83 by performing exposure and development using photolithography.

Step 4

Figure 4D:
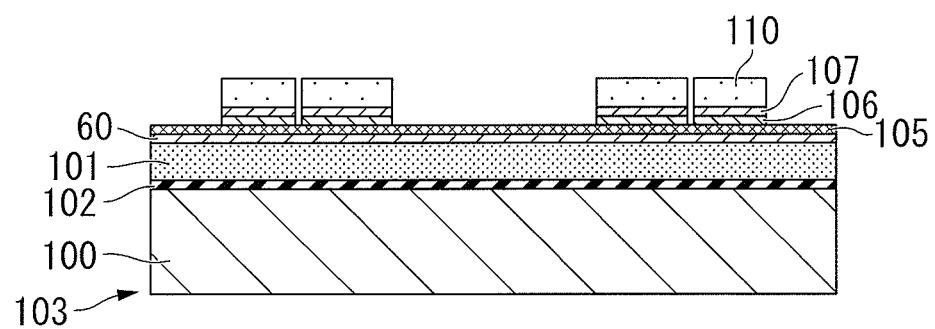
FIG. 4D is a process diagram for describing the manufacturing method of the optical scanning element shown in FIG. 2, and a cross-sectional diagram corresponding to FIG. 3.

As shown in FIG. 4D, using the resist 110 as a mask, the sputtered films 106 and 107 of the upper electrodes 75 and 83 and the piezoelectric layers 74 and 82 are etched.

Step 5

Figure 4E:
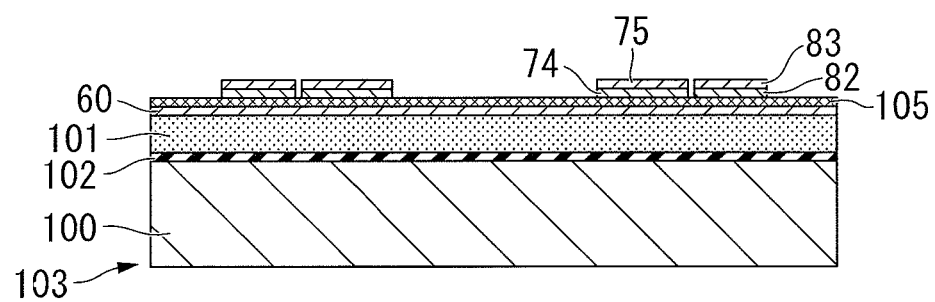
FIG. 4E is a process diagram for describing the manufacturing method of the optical scanning element shown in FIG. 2, and a cross-sectional diagram corresponding to FIG. 3.

Then, as shown in FIG. 4E, the resist 110 is exfoliated. Thereby, the upper electrodes 75 and 83, and the piezoelectric layers 74 and 82 are formed.

Step 6

Figure 5A:
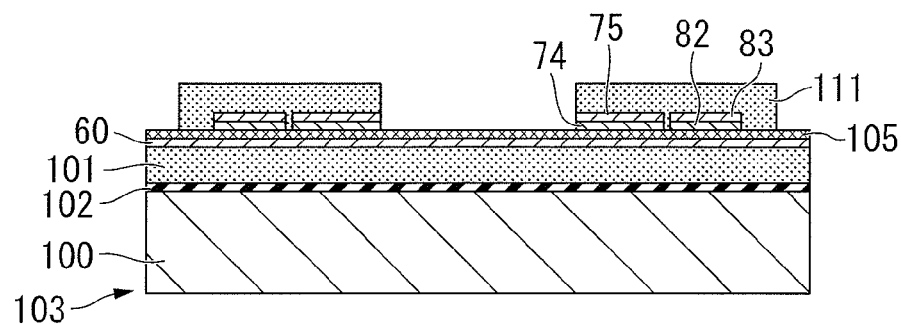
FIG. 5A is a process diagram for describing the manufacturing method of the optical scanning element shown in FIG. 2, and a cross-sectional diagram corresponding to FIG. 3.

Next, as shown in FIG. 5A, a resist 111 is applied on the entire region of the active layer 101 so as to cover the upper electrodes 75 and 83. By performing exposure and development using photolithography, patterning is performed so that the resist 111 remains at the formation regions of the lower electrodes 73 and 81 and the electrode film 87 and the oxide film 60.

Step 7

Figure 5B:
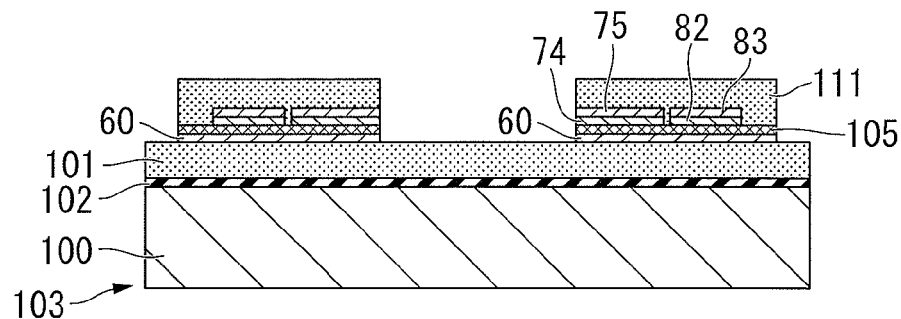
FIG. 5B is a process diagram for describing the manufacturing method of the optical scanning element shown in FIG. 2, and a cross-sectional diagram corresponding to FIG. 3.

Next, as shown in FIG. 5B, using the resist 111 as a mask, the lower electrodes 73 and 81, the sputtered film 107 of and the electrode film 87, and the oxide film 60 are etched.

Step 8

Figure 5C:
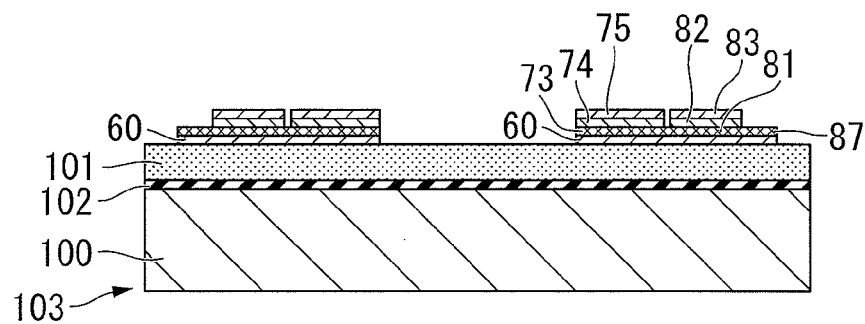
FIG. 5C is a process diagram for describing the manufacturing method of the optical scanning element shown in FIG. 2, and a cross-sectional diagram corresponding to FIG. 3.

Then, as shown in FIG. 5C, the resist 111 is exfoliated. Thereby, the lower electrodes 73 and 81, the electrode film 87, and the oxide film 60 are formed.

Step 9

Figure 5D:
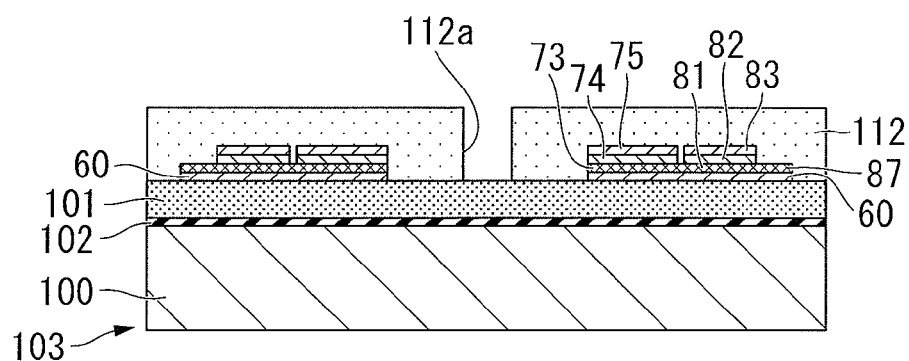
FIG. 5D is a process diagram for describing the manufacturing method of the optical scanning element shown in FIG. 2, and a cross-sectional diagram corresponding to FIG. 3.

Next, a reflecting film 67 is formed at the formation region of the oscillating mirror 57 on the active layer 101. Specifically, as shown in FIG. 5D, a resist 112 is applied on the entire region of the active layer 101. By performing exposure and development using photolithography, patterning is performed so that the resist 112 remains at regions other than the formation region of the reflecting film 67 (the formation region of the oscillating mirror 57). That is to say, an opening portion 112a of the resist 112 is formed at the formation region of the reflecting film 67.

Step 10

Figure 5E:
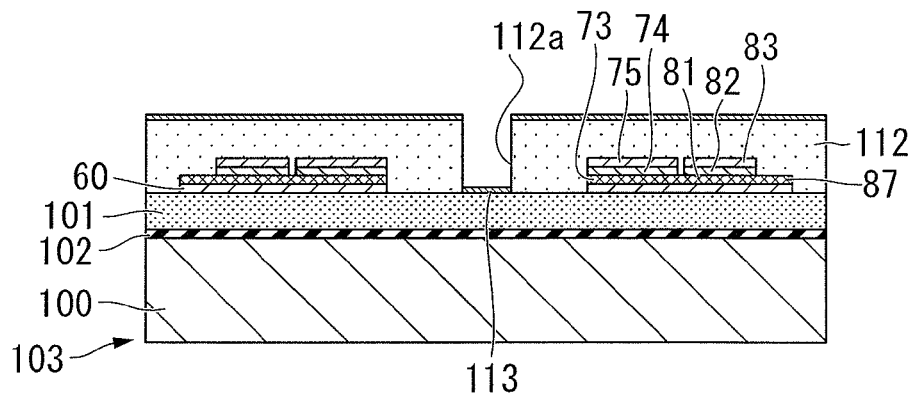
FIG. 5E is a process diagram for describing the manufacturing method of the optical scanning element shown in FIG. 2, and a cross-sectional diagram corresponding to FIG. 3.

Next, as shown in FIG. 5E, using the resist 112 as a mask, when silver or the like is deposited by vapor deposition or the like, a vapor-deposited film 113 is formed on the active layer 101 through the opening portion 112a of the resist 112.

Step 11

Figure 6A:
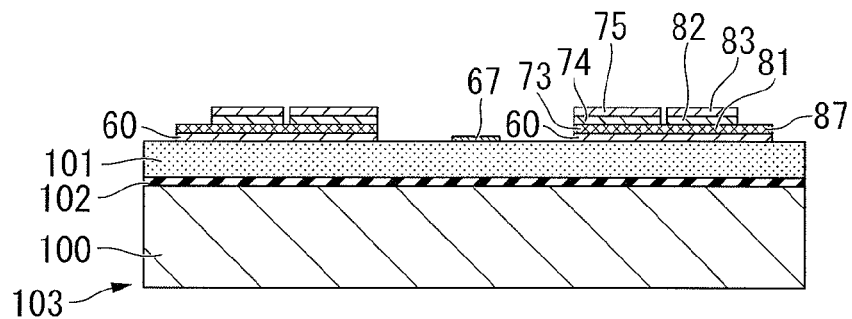
FIG. 6A is a process diagram for describing the manufacturing method of the optical scanning element shown in FIG. 2, and a cross-sectional diagram corresponding to FIG. 3.

Then, as shown in FIG. 6A, the resist 112 is exfoliated. Thereby, the reflecting film 67 is formed at the formation region of the oscillating mirror 57.

Step 12

Figure 6B:
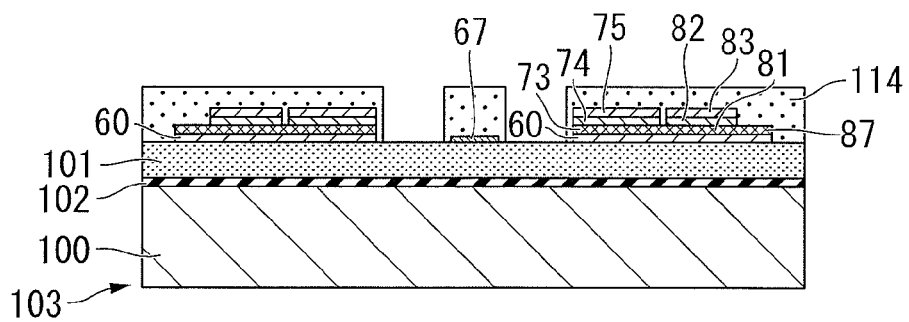
FIG. 6B is a process diagram for describing the manufacturing method of the optical scanning element shown in FIG. 2, and a cross-sectional diagram corresponding to FIG. 3.

Next, the outer shapes of the oscillating mirror 57 and the bridging unit 59 are formed. Specifically, as shown in FIG. 6B, a resist 114 is applied on the entire region of the active layer 101. By performing exposure and development using photolithography, patterning is performed so that the resist 114 remains at the formation region of the upper frame 52 (the base unit 56, the oscillating mirror 57 and the bridging unit 59).

Step 13

Figure 6C:
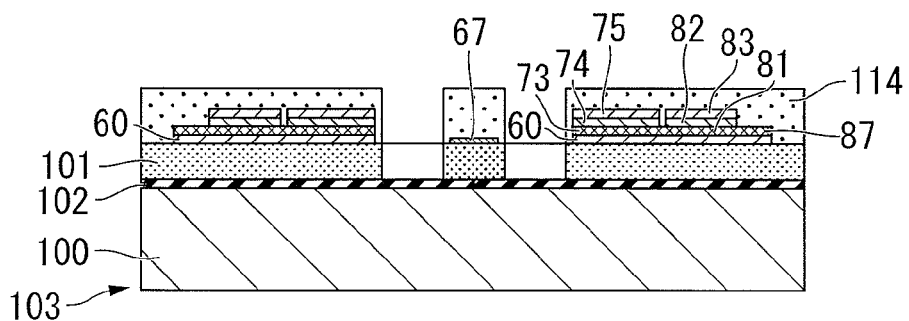
FIG. 6C is a process diagram for describing the manufacturing method of the optical scanning element shown in FIG. 2, and a cross-sectional diagram corresponding to FIG. 3.

Then, as shown in FIG. 6C, with the resist 114 serving as a mask etching (DRIE: Deep Reactive Ion Etching) is performed. Oxide film removal (BOE etching or the like) is performed as needed prior to that.

Step 14

Figure 6D:
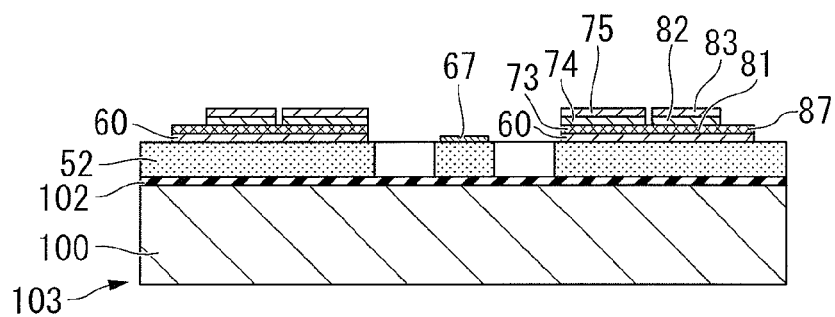
FIG. 6D is a process diagram for describing the manufacturing method of the optical scanning element shown in FIG. 2, and a cross-sectional diagram corresponding to FIG. 3.

After that, as shown in FIG. 6D, the resist 114 is exfoliated. Thereby, a state results in which the oscillating mirror 57 is coupled to the bridging unit 59 at the inner side of the base unit 56 (refer to FIG. 3).

Step 15

Figure 6E:
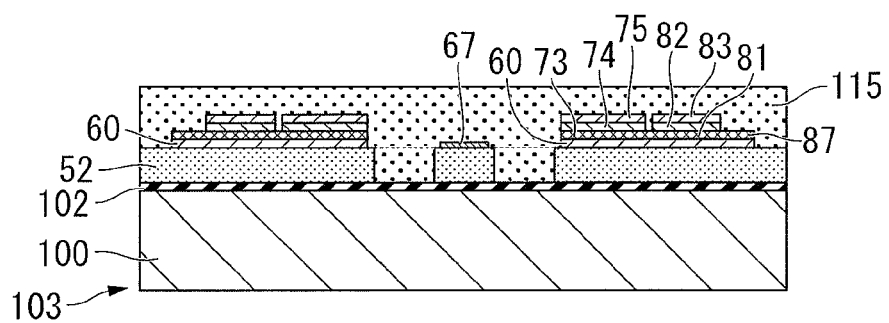
FIG. 6E is a process diagram for describing the manufacturing method of the optical scanning element shown in FIG. 2, and a cross-sectional diagram corresponding to FIG. 3.

Next, the lower frame 53 is formed. Specifically, as shown in FIG. 6E, first, a protective film 115 that covers the upper frame 52 is formed.

Step 16

Figure 7A:
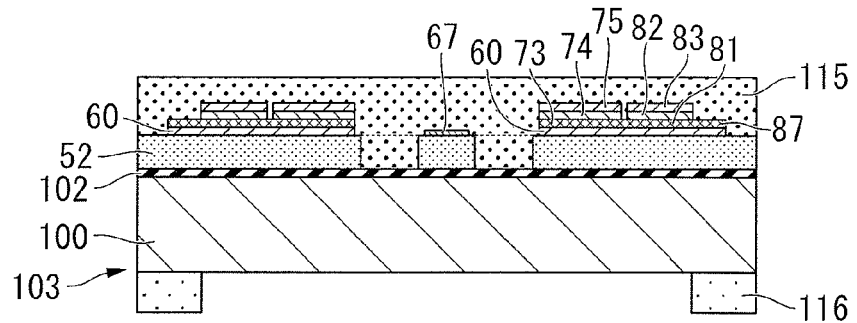
FIG. 7A is a process diagram for describing the manufacturing method of the optical scanning element shown in FIG. 2, and a cross-sectional diagram corresponding to FIG. 3.

Next, as shown in FIG. 7A, a resist 116 is applied over the entire region of the undersurface of the support Si layer 100. By performing exposure and development using photolithography, patterning is performed so that the resist 116 remains at the formation region of the lower frame 53.

Step 17

Figure 7B:
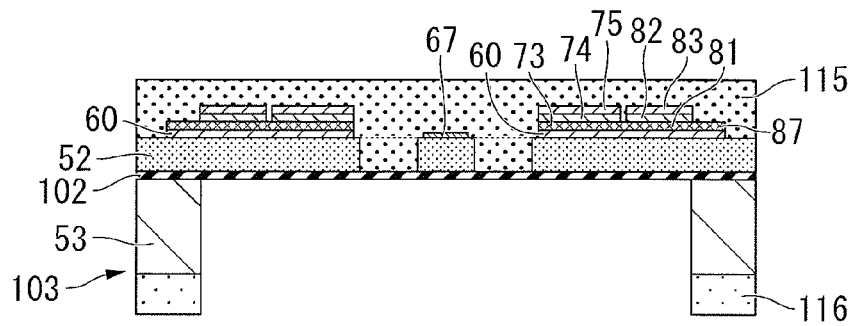
FIG. 7B is a process diagram for describing the manufacturing method of the optical scanning element shown in FIG. 2, and a cross-sectional diagram corresponding to FIG. 3.

Next, as shown in FIG. 7B, by etching (DRIE) the support Si layer 100 with the resist 116 serving as a mask, the lower frame 53 is formed.

Step 18

Figure 7C:
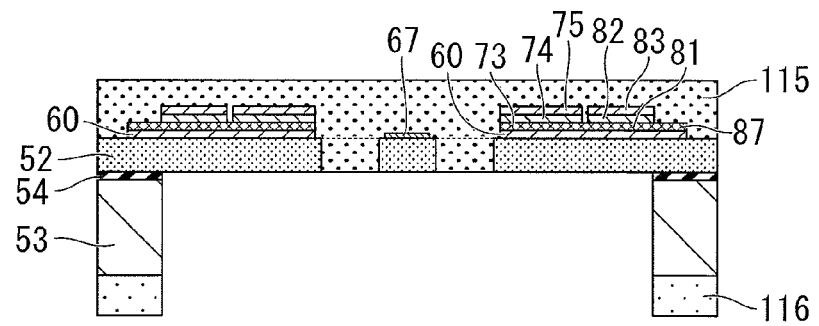
FIG. 7C is a process diagram for describing the manufacturing method of the optical scanning element shown in FIG. 2, and a cross-sectional diagram corresponding to FIG. 3.

Then, as shown in FIG. 7C, etching (DRIE) is again performed with the resist 116 serving as a mask, and the oxide film 102 on the interior side of the lower frame 53 is removed.

Step 19

Figure 7D:
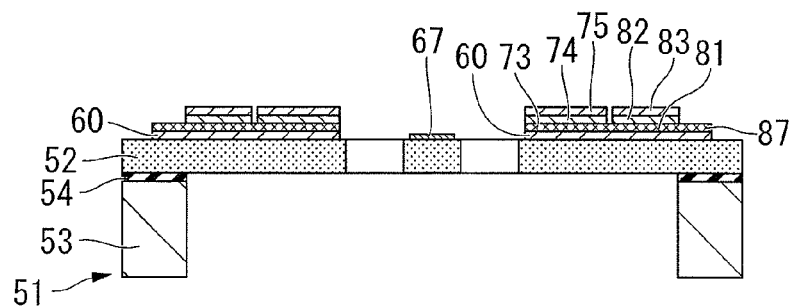
FIG. 7D is a process diagram for describing the manufacturing method of the optical scanning element shown in FIG. 2, and a cross-sectional diagram corresponding to FIG. 3.

As shown in FIG. 7D, the resist 116 and the protective film 115 are exfoliated. Thereby, a plurality of the optical scanning elements 51 are formed on the SOI substrate 103 in a coupled state.

Step 20

Finally, the SOI substrate 103 is fragmented into individual optical scanning elements 51 by dicing. Thereby, it is possible to manufacture a plurality of the aforementioned optical scanning elements from a single SOI substrate 103.

In this way, the present exemplary embodiment has a constitution that provides the adjusting unit 64 that adjusts the modulus of elasticity of the beam unit 62 sandwiching the driving unit 63, with the beam unit 62 the opposite side.

With this constitution, the driving unit 63, to which an alternating voltage is applied during driving of the oscillating mirror 57, and the adjusting unit 64, to which a direct voltage is applied to adjust the modulus of elasticity of the beam unit 62, are separated. Accordingly, the influence of torsional oscillation of the beam unit 62 that acts on the adjusting unit 64 is reduced. Thereby, it is possible to perform adjustment of the resonance frequency by the adjusting unit 64 with high accuracy. Therefore, it is possible to suppress variations of the resonance frequency due to temperature changes and the fabrication process and the like, as with before. Moreover, the adjusting unit 64 is formed with a width and thickness so as not to be affected by deformation and the like during oscillation of the beam unit 62. For that reason, it is possible to reliably prevent deformation of the adjusting unit 64 associated with oscillation of the beam unit 62.

Accordingly, it is possible to provide the reliable optical scanning element 51 that can raise the adjustment accuracy of the resonant frequency and maintain a stable operation.

Also, since the driving unit 63 is provided at each bridging unit 59, stress is imparted from both end sides to the oscillating mirror 57. For that reason, it is possible to increase the rotation angle (oscillation angle) of the oscillation mirror 57, and drive it with a high degree of accuracy.

Moreover, the adjusting unit 64 is provided at each bridging unit 59. For that reason, it is possible to increase the internal stress that acts on the beam unit 62, and it is possible to raise the frequency adjustment rate. Also, it is possible to evenly adjust the modulus of elasticity of each beam unit 62. Thereby, it is possible to improve the scanning accuracy.

Also, the driving unit 63 and the adjusting unit 64 respectively include the piezoelectric elements 72 and 80. For this reason, it is possible to independently perform driving of the oscillation mirror 57 by the driving unit 63 and adjustment of the resonance frequency by the adjusting unit 64. Moreover, since the piezoelectric elements 72 and 80 are integrally formed by a semiconductor process, it is possible to suppress an increase in the fabrication processes, and achieve a cost reduction.

In the present exemplary embodiment, by integrally forming the optical scanning element 51 with a semiconductor process, it is possible to achieve miniaturization and a cost reduction of the optical scanning element 51. Also, due to the reduced size, it is possible to achieve a speed increase. Also, since the stress that acts from the driving unit 63 to the beam unit 62 is directly transmitted, it is possible to obtain high driving efficiency.

Furthermore, in the present exemplary embodiment, it is possible to integrally form the adjusting unit 64 between the driving unit 63 and the base unit 56. For that reason, a simplification of the constitution is achieved, and a new process is not required for adding the adjusting unit 64. Accordingly, it is possible to improve the work efficiency and suppress an increase in costs by the addition of the adjusting unit 64.

Second Exemplary Embodiment

Figure 8:
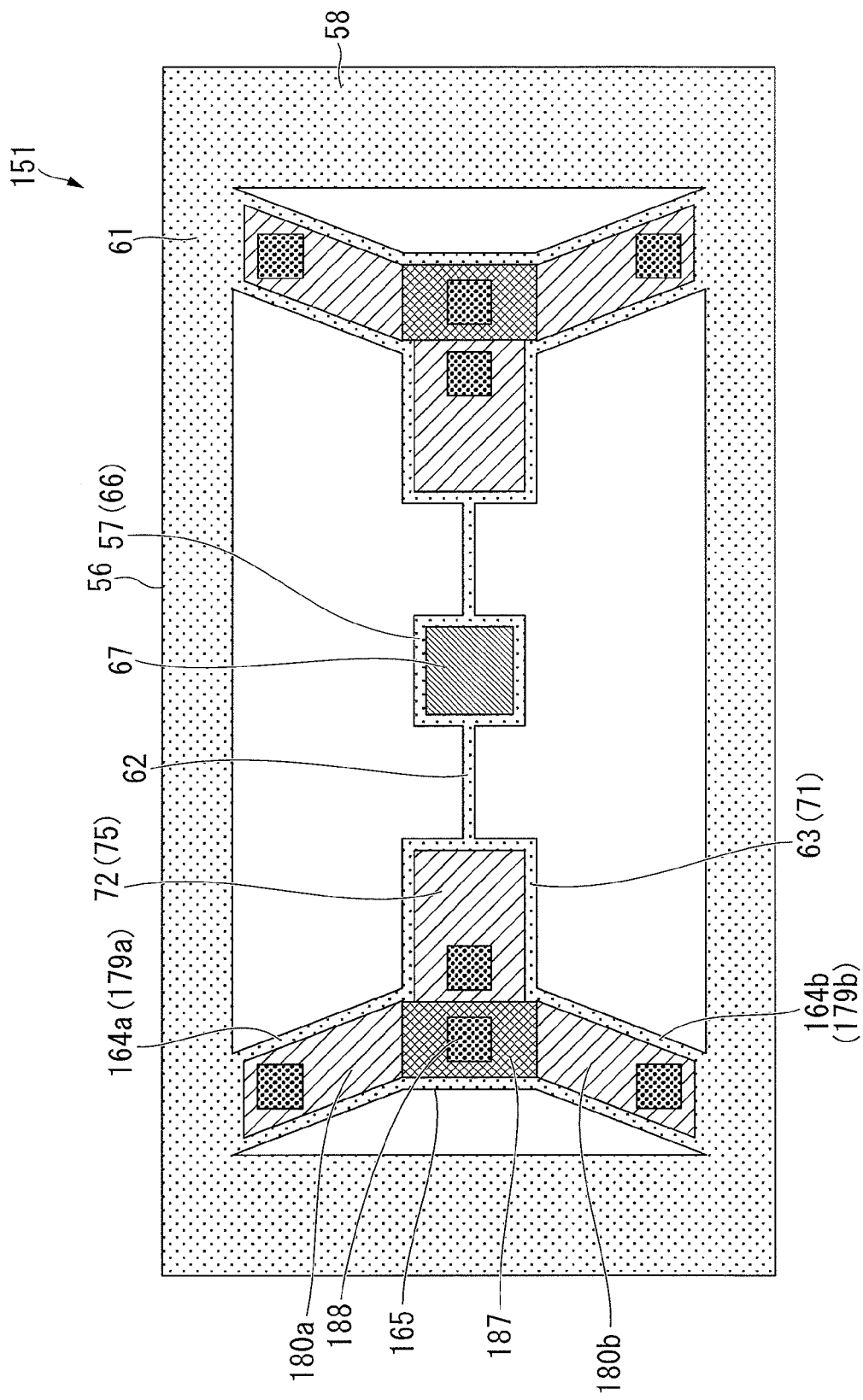
FIG. 8 is a diagram that shows the constitution of an optical scanning element in a second exemplary embodiment of the present invention, and a cross-sectional diagram corresponding to FIG. 3.

Next, the second exemplary embodiment of the present invention shall be described. FIG. 8 is a plan view of an optical scanning element in the second exemplary embodiment. In the following description, constitutions that are the same as those of the aforementioned first exemplary embodiment shall be denoted by the same reference symbols, with descriptions thereof being omitted.

As shown in FIG. 8, an optical scanning element 151 of the present exemplary embodiment includes an oscillating mirror 57, a pair of beam units 62, a driving unit 63, a plurality of adjusting units 164*a* and 164*b*, and a base unit 56. The pair of beam units 62 are coupled to the oscillating mirror 57. The driving unit 63, by being coupled to the beam unit 62, drives the oscillating mirror 57. A plurality of adjusting units 164*a* and 164*b* adjust the modulus of elasticity of the beam unit 62. The base unit 56 fixes the adjusting units 164*a* and 164*b* from the outer side thereof.

A coupling unit 165 that collectively couples the basal end of the driving unit 63 and the distal ends of the adjusting units 164*a* and 164*b* is formed at the basal end side of the driving unit 63. A pair of adjusting units 164*a* and 164*b* that extend in a fork shape from both end sides in the width direction of the coupling unit 165 toward the long side unit 61 of the base unit 56 are coupled to this coupling unit 165. These adjusting units 164*a* and 164*b* are arranged at symmetric positions with respect to the width direction of the driving unit 63. The driving unit 63, the coupling unit 165, and the adjusting units 164*a* and 164*b* are integrally formed in a Y shape in plan view. That is to say, the adjusting units 164*a* and 164*b* extend along directions that intersect with the extension directions of the long side unit 61 and the short side unit 58. In the optical scanning element 151 of the present exemplary embodiment, the driving unit 63 (coupling unit 165) and the long side unit 61 are bridged by the pair of adjusting units 164*a* and 164*b*. Each adjusting unit 164*a* and 164*b* is constituted so that piezoelectric elements 180*a* and 180*b* are formed on the adjusting unit substrates 179*a* and 179*b* in the same way as the aforementioned first exemplary embodiment. The electrode film 187 and the electrode pad 188 are formed on the coupling unit 165. The electrode film 187 is continuously formed from the lower electrodes 73 and 81 of the piezoelectric elements 180*a* and 180*b* (refer to FIG. 3). The electrode pad 188 is formed on the electrode film 190, and is used for applying a voltage to the adjusting units 164*a* and 164*b* and the lower electrodes 73 and 81 of the driving unit 63.

The present exemplary embodiment exhibits the same effect as the aforementioned first exemplary embodiment. Moreover, according to the present exemplary embodiment, since a plurality (two) of the adjusting units 164*a* and 164*b* are arranged at symmetrical positions with respect to the width direction of the driving unit 63 and the beam unit 62, it is possible to stably support the driving unit 63 and the beam unit 62. Thereby, since the internal stress that acts from the driving unit 63 is evenly dispersed to each of the adjusting units 164a and 164b, it is possible to further reduce the influence by the oscillation of the oscillating mirror 57.

Also, the adjusting unit 64 is inclined in an oblique direction with respect to the extension direction of the beam unit 62. For this reason, compared to the case of the adjusting unit 64 being perpendicular to the extension direction of the beam unit 62, among the stress that is generated in the piezoelectric elements 180a and 180b of the adjusting unit 64, it is possible to utilize the force component along the extension direction of the beam unit 62 to the maximum extent as a compressive and tensile component of the beam unit 62.

Third Exemplary Embodiment

Figure 9:
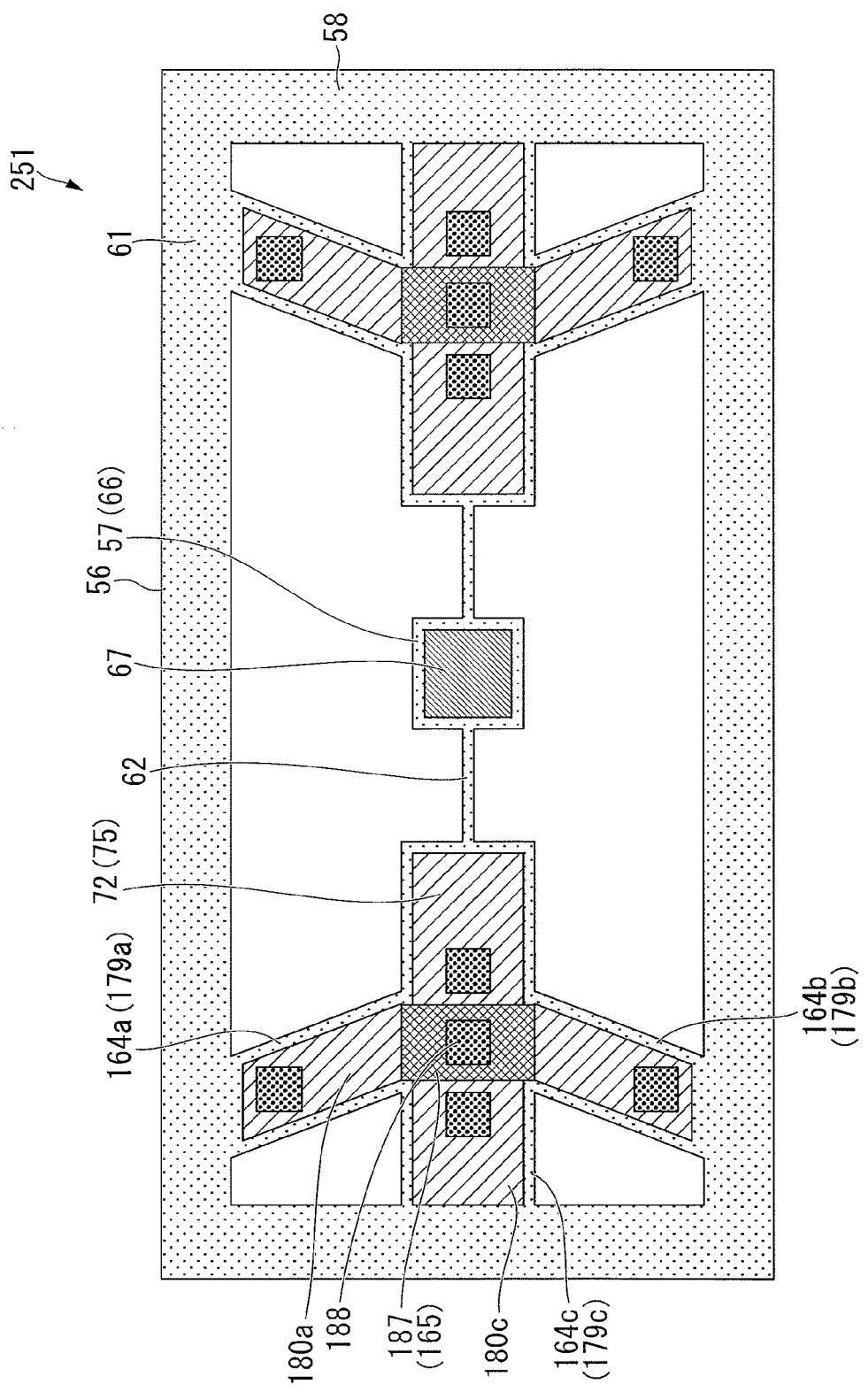
FIG. 9 is a diagram that shows the constitution of an optical scanning element in a third exemplary embodiment of the present invention, and a cross-sectional diagram corresponding to FIG. 3.

Next, the third exemplary embodiment of the present invention shall be described. FIG. 9 is a plan view of an optical scanning element in the third exemplary embodiment. In the following description, constitutions that are the same as those of the aforementioned first exemplary embodiment shall be denoted by the same reference symbols, with descriptions thereof being omitted. In the aforementioned second exemplary embodiment, the constitution was described of the driving unit 63 and the base unit 56 being coupled by the two adjusting units 164a and 164b via the coupling unit 165, but it is not limited thereto. There may be a plurality of two or more of the adjusting unit.

Specifically, as shown in FIG. 9, an optical scanning element 251 of the present exemplary embodiment includes three adjusting units 164a, 164b, and 164c. The two adjusting units 164a and 164b extend from both end sides of the coupling unit 165 in the width direction to the long side units 61 in an oblique direction. The adjusting unit 164c extends from the basal end side of the coupling unit 165 to the short side unit 58. That is to say, the optical scanning element 251 of the present exemplary embodiment includes the pair of adjusting units 164a and 164b that are connected in parallel to symmetrical positions with respect to the width direction of the driving unit 63, and the adjusting unit 164c that is connected in series along the extension direction of the driving unit 63. Each driving unit 164c is constituted by a piezoelectric element 180c being formed on an adjusting unit substrate 179c, in the same manner as the aforementioned first exemplary embodiment.

The present exemplary embodiment, in addition to exhibiting the same effect as the aforementioned second exemplary embodiment, can more stably support the driving unit 63 and the beam unit 62, by supporting the driving unit 63 with the three adjusting units 164a to 164c. Thereby, the internal stress that acts from the driving unit 63 is evenly dispersed to each of the adjusting units 164a to 164c, and it is possible to further reduce the influence due to oscillation of the oscillating mirror 57.

Fourth Exemplary Embodiment

Figure 10:
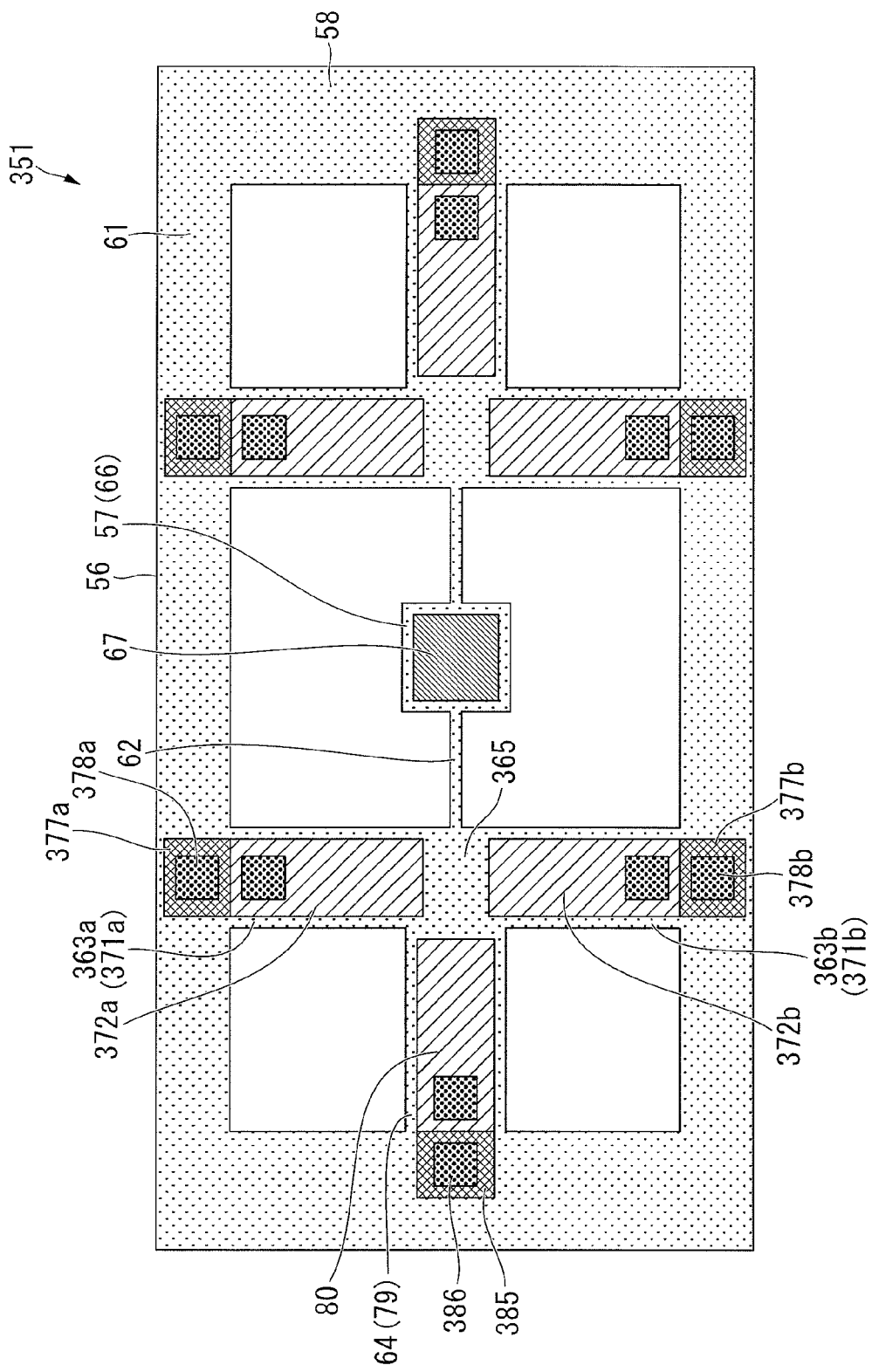
FIG. 10 is a diagram that shows the constitution of an optical scanning element in a fourth exemplary embodiment of the present invention, and a cross-sectional diagram corresponding to FIG. 3.

Next, the fourth exemplary embodiment of the present invention shall be described. FIG. 10 is a plan view of an optical scanning element in the fourth exemplary embodiment. In the following description, constitutions that are the same as those of the aforementioned first exemplary embodiment shall be denoted by the same reference symbols, with descriptions thereof being omitted. The present exemplary embodiment differs from the aforementioned exemplary embodiments on the point of a plurality of driving units being provided.

As shown in FIG. 10, an optical scanning element 351 of the present exemplary embodiment includes the oscillating mirror 57, the beam unit 62, a coupling unit 365, a plurality of driving units 363a and 363b, and the adjusting unit 64. The beam unit 62 is coupled to the oscillating mirror 57. The coupling unit 365 is coupled to the basal end side of the beam unit 62. The plurality of driving units 363a and 363b respectively extend in directions perpendicular to the extension direction of the beam unit 62 via the coupling unit 365. The adjusting unit 64 extends along the extension direction of the beam unit 62 via the coupling unit 365.

The driving units 363a and 363b extend from both end sides in the width direction of the coupling unit 365 toward the long side units 61 that are respectively opposite. The driving units 363a and 363b are formed so as to bridge between the long side units 61 by the driving units 363a and 363b and the coupling unit 365. The driving units 363a and 363b are constituted by piezoelectric elements 372a and 372b being formed on the driving unit substrates 371a and 371b, in the same manner as the aforementioned first exemplary embodiment. Electrodes films 377a and 377b that are continuously formed from the lower electrode 73 (refer to FIG. 3) of the driving units 363a and 363b are formed on each long side unit 61. The electrode pads 378a and 378b are formed on the electrode films 377a and 377b.

The adjusting unit 64 is the same as that in the aforementioned first exemplary embodiment, and is constituted by the piezoelectric element 80 being formed on the adjusting unit substrate 79. An electrode film 385 that is formed continuously from the lower electrode 81 of the piezoelectric element 80 in each adjusting unit 64 (refer to FIG. 3) is formed on each short side unit 58. An electrode pad 386 is formed on the electrode film 385.

In this case, when a voltage is applied between the electrodes 73 and 75 (refer to FIG. 3) that are arranged on the front surface or rear surface of the piezoelectric layer 74 (refer to FIG. 3) at the driving units 363a and 363b, the piezoelectric layer 74 is driven, whereby the length of the piezoelectric layer 74 changes along the extension direction of the beam unit 62. Specifically, by applying an alternating voltage to the piezoelectric element 372a of the driving unit 363a that supports one beam unit 62, internal stress is generated. Also, an alternating voltage of a reverse phase than the driving unit 363a is applied to the piezoelectric element 372b of the driving unit 363b that supports the one beam unit 62. Thereby, the internal stress that is produced in the beam unit 62 produces an action that causes the oscillating mirror 57 to oscillate. After being started in this way, it is possible to increase the oscillation angle by resonance oscillation.

In contrast to this, an alternating voltage of the same phase as the driving unit 363a that supports the one beam unit 62 is applied to the driving unit 363a that supports the other beam unit 62, and an alternating voltage of the same phase as the driving unit 363b that supports the one beam unit 62 is applied to the driving unit 363b that supports the other beam unit 62. By applying the alternating voltage in this way, it is possible to reinforce the internal stress that is produced in the beam unit 62. That is to say, while applying alternating voltages of reverse phase between the pair of driving units 363a and 363b, alternating voltages of the same phase are applied to the corresponding driving units (the driving units 363a and the driving units 363b) between each beam unit 62.

In this way, according to the present exemplary embodiment, in addition to exhibiting the same effect as the aforementioned exemplary embodiments, the adjusting unit 64 is arranged at a position perpendicular to the extension direction of the driving unit 363a and 363b. Thereby, it is possible to further reduce the internal stress that acts from the driving units 363a and 363b to the adjusting unit 64. Moreover, since the adjusting unit 64 is arranged parallel to the extension direction of the beam unit 62, the component that acts in the extension direction of the beam unit 62, among the stress that is produced by the adjusting unit 64, comes to be maximized. Accordingly, it is possible to perform adjustment of the resonance frequency by the adjusting unit 64 with a high degree of accuracy, and it is possible to reduce the effect of the oscillating mirror 57 that acts on the adjusting unit 64.

Also, among the driving force that the driving units 363a and 363b impart to the beam unit 62, the lateral oscillation (in the direction perpendicular to the extension direction of the beam unit 62 in plan view) is inhibited, and the driving force for the oscillating mirror 57 is utilized to the maximum extent.

Fifth Exemplary Embodiment

Figure 11:
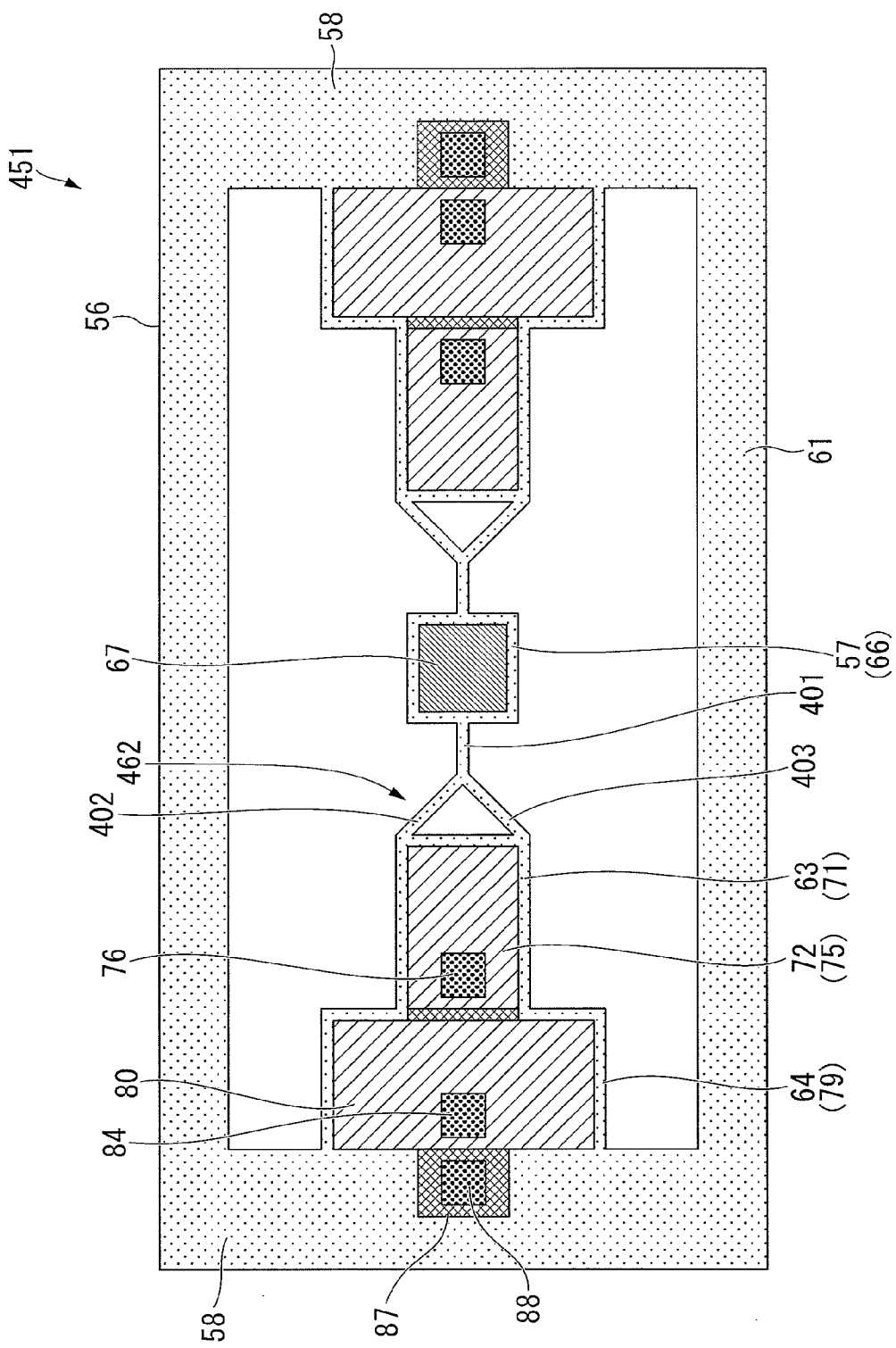
FIG. 11 is a diagram that shows the constitution of an optical scanning element in a fifth exemplary embodiment of the present invention, and a cross-sectional diagram corresponding to FIG. 3.

Next, the fifth exemplary embodiment of the present invention shall be described. FIG. 11 is a plan view of the optical scanning element in the fifth exemplary embodiment. In the following description, constitutions that are the same as those of the aforementioned first exemplary embodiment shall be denoted by the same reference symbols, with descriptions thereof being omitted.

As shown in FIG. 11, a beam unit 462 of an optical scanning element 451 in the present exemplary embodiment includes a beam unit main body 401, and two beam supporting units 402 and 403. The beam unit main body 401 extends respectively from both end portions of the oscillating mirror 57. The two beam supporting units 402 and 403 extend in a fork shape from the basal end side of the beam unit main body 401, and are integrally coupled to both sides in the width direction of the driving unit 63. That is to say, each beam unit 462 is formed in a Y shape in plan view.

In this case, by applying a direct voltage via the electrode pads 84 and 88 to the piezoelectric element 80 of the adjusting unit 64, internal stress is produced in the adjusting unit 64. This stress, after being transmitted to the beam supporting units 402 and 403 via the driving unit 63, is transmitted to the beam unit main body 401. By doing so, the length or shape of the beam supporting units 402 and 403 or the beam unit main body 401 changes.

Thereby, due to the modulus of elasticity of the beam supporting units 402 and 403 or the beam unit main body 401 changing, it is possible to change the resonance frequency. Also, the variation in the modulus of elasticity of the beam supporting units 402 and 403 or the beam unit main body 401 changes by regulating the voltage that is applied to the voltage element 80.

In the present exemplary embodiment, in addition to exhibiting the same effect as the aforementioned exemplary embodiments, the stress that is added from the adjusting unit 64 to the beam supporting units 402 and 403 via the driving unit 63 is easily utilized for the shape change of the beam unit main body 401, and so it is possible to improve the efficiency of frequency adjustment. In this case, since the torsion spring constant of the entire beam unit main body 401 and the beam supporting units 402 and 403 changes, it is suitable for enhancing the effect of the stress due to the adjusting unit 64.

By the aforementioned second to fourth exemplary embodiments also having the same beam supporting units 402 and 403, it is clear that the effect of the frequency adjustment by the adjusting unit 64 is magnified.

The exemplary embodiments of the present invention were described in detail hereinabove with reference to the drawings, but specific constitutions are not limited to only these exemplary embodiments, and design modifications are also included within a range that does not depart from the scope of the present invention.

For example, the first exemplary embodiment adopts a constitution that couples the respective driving units 63 to each beam unit 62, but is not limited thereto. It is also acceptable to adopt a constitution that couples the driving unit 63 to at least one beam unit 62. Also, it has a constitution that arranges the adjusting units 64 between the driving units 63 and the base units 56, but is not limited thereto. It is acceptable to adopt a constitution that arranges the adjusting unit 64 only between one driving unit 63 and one base unit 56.

It is also acceptable to adopt a constitution that suitably combines constitutions of the aforementioned exemplary embodiments.

A description was given above for a constitution that adopts the optical scanning device of the exemplary embodiments of the present invention for a horizontal scanning element 51 in the image display device 1, but it may also be adopted for a vertical scanning element 43.

The optical scanning device of the exemplary embodiments of the present invention described above can be adopted as an optical scanning device of a digital copier, a laser printer, a bar code reader and the like, without being limited to the optical scanning element 51 in the image display device 1.

Also, the driving unit and the adjusting unit may be provided in a plurality or two or more.

This application is based upon and claims the benefit of priority from Japanese patent application No. 2009-260881, filed on Nov. 16, 2009, the disclosure of which is incorporated herein in its entirety by reference.

INDUSTRIAL APPLICABILITY

The present invention can be applied to an optical scanning device. With this optical scanning device, it is possible to adjust the resonance frequency with a high degree of accuracy by a simple constitution, and it is possible to maintain a stable operation.

DESCRIPTION OF REFERENCE SYMBOLS 51, 151, 251, 351, 451 Horizontal scanning element (optical scanning device)
57 Oscillating mirror
62, 462 Beam unit (first beam unit, second beam unit)
63, 363a, 363b Driving unit (first driving unit, second driving unit)
64, 164a, 164b, 164c Adjusting unit (first adjusting unit, second adjusting unit)
72 Piezoelectric element
80, 180a, 180b, 180c Piezoelectric element
91 Electrostatic capacitance detecting circuit (resonance frequency detecting unit)

The invention claimed is:

1. An optical scanning device comprising:
an oscillating mirror that reflects incident light;
a first beam unit that is coupled to one end of the oscillating mirror, the first beam unit extending in a first direction;
a second beam unit that is coupled to another end of the oscillating mirror;
a first driving unit that is coupled to the first beam unit; and
a first adjusting unit that is coupled to the first driving unit, the first driving unit being disposed between the first beam unit and the first adjusting unit, and causing the oscillating mirror to oscillate, the first adjusting unit adjusting a modulus of elasticity of the first beam unit by elastically deforming the first beam unit, and a length of the first driving unit in a second direction being shorter than a length of the first adjusting unit in the second direction, the second direction being perpendicular to the first direction.

2. The optical scanning device according to claim 1, wherein the first driving unit includes a piezoelectric element.

3. The optical scanning device according to claim 1, wherein the first adjusting unit includes a piezoelectric element.

4. The optical scanning device according to claim 1, wherein the first beam unit includes a beam supporting unit having a structure that branches into at least two or more toward the first driving unit.

5. The optical scanning device according to claim 1, wherein the first driving unit is formed at at least two or more of symmetric positions with respect to the first beam unit.

6. The optical scanning device according to claim 1, wherein the first adjusting unit is formed at at least two or more of symmetric positions with respect to the first beam unit.

7. The optical scanning device according to claim 1, wherein the oscillating mirror, the first beam unit, the first driving unit, and the first adjusting unit are integrally formed.

8. The optical scanning device according to claim 1, further comprising:
a resonance frequency detecting unit that detects the resonance frequency of the oscillating mirror,
wherein the first adjusting unit is controlled so that the resonance frequency becomes constant.

9. The optical scanning device according to claim 1, further comprising:
a second driving unit that is coupled to the second beam unit and that causes the oscillating mirror to oscillate.

10. The optical scanning device according to claim 9, further comprising:
a second adjusting unit that is coupled to the second driving unit, elastically deforms the second beam unit, and adjusts a modulus of elasticity of the second beam unit.

11. The optical scanning device according to claim 9, wherein the second driving unit includes a piezoelectric element.

12. The optical scanning device according to claim 10, wherein the second adjusting unit includes piezoelectric element.

13. The optical scanning device according to claim 9, wherein the second beam unit includes a beam supporting unit having a structure that branches into at least two or more toward the second driving unit.

14. The optical scanning device according to claim 9, wherein the second driving unit is formed at least two or more of symmetric positions with respect to the second beam unit.

15. The optical scanning device according to claim 9, wherein the second adjusting unit is formed at least two or more of symmetric positions with respect to the first beam unit.

16. The optical scanning device according to claim 9, wherein the oscillating mirror, the second beam unit, the second driving unit, and the second adjusting unit are integrally formed.

17. The optical scanning device according to claim 9, further comprising:
a resonance frequency detecting unit that detects a resonance frequency of the oscillating mirror,
wherein the second adjusting unit is controlled so that the resonance frequency becomes constant.

18. The optical scanning device according to claim 1, further comprising:
a base unit having a rectangular frame shape and surrounding the oscillating mirror, the base unit comprising:
a first long side unit extending in the first direction;
a second long side unit facing the first long side unit and extending in the first direction;
a first short side unit connected to the first long side unit and the second long side unit and extending in the second direction,
the first adjusting unit extending from the first short side unit, and
the first driving unit being separate from the first short side unit, and the first adjusting unit being disposed between the first driving unit and the first short side unit.

19. The optical scanning device according to claim 18, further comprising:
a second driving unit that is coupled to the second beam unit; and
a second adjusting unit that is coupled to the second driving unit,
the second driving unit being disposed between the second beam unit and the second adjusting unit, and causing the oscillating mirror to oscillate,
the second adjusting unit adjusting a modulus of elasticity of the second beam unit by elastically deforming the second beam unit, and
the second driving unit being separate from the second short side unit, and the second adjusting unit being disposed between the second driving unit and the second short side unit.

* * * * *